US009087743B2

(12) United States Patent
Liu et al.

(10) Patent No.: US 9,087,743 B2
(45) Date of Patent: Jul. 21, 2015

(54) SILICON-ON-INSULATOR FINFET WITH BULK SOURCE AND DRAIN

(71) Applicant: GLOBALFOUNDRIES Inc., Grand Cayman (KY)

(72) Inventors: Yanxiang Liu, Glenville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/084,899

(22) Filed: Nov. 20, 2013

(65) Prior Publication Data

US 2015/0137236 A1    May 21, 2015

(51) Int. Cl.
*H01L 21/4763* (2006.01)
*H01L 27/12* (2006.01)
*H01L 21/84* (2006.01)

(52) U.S. Cl.
CPC .......... *H01L 27/1211* (2013.01); *H01L 21/845* (2013.01)

(58) Field of Classification Search
CPC ............... H01L 21/823821; H01L 21/845; H01L 29/7855; H01L 29/7853
USPC .......................................... 438/595; 257/206
See application file for complete search history.

(56) References Cited

U.S. PATENT DOCUMENTS

| 8,466,012 | B1 * | 6/2013 | Chang et al. ................... 438/149 |
| 8,624,320 | B2 | 1/2014 | Schultz |
| 2005/0239242 | A1 * | 10/2005 | Zhu et al. ....................... 438/199 |
| 2006/0027870 | A1 * | 2/2006 | Inaba ............................... 257/353 |
| 2007/0085134 | A1 * | 4/2007 | Anderson et al. ............... 257/326 |
| 2011/0316081 | A1 * | 12/2011 | Chan et al. ...................... 257/347 |

* cited by examiner

*Primary Examiner* — Caridad Everhart
(74) *Attorney, Agent, or Firm* — Williams Morgan, P.C.

(57) ABSTRACT

Embodiments of the invention provide a semiconductor structure including a finFET having an epitaxial semiconductor region in direct physical contact with a plurality of fins, wherein the epitaxial semiconductor region traverses an insulator layer and is in direct physical contact with the semiconductor substrate. The gate of the finFET is disposed over an insulator layer, such as a buried oxide layer. Methods of forming the semiconductor structure are also included.

20 Claims, 10 Drawing Sheets

SILICON-ON-INSULATOR FINFET WITH BULK SOURCE AND DRAIN

FIELD OF THE INVENTION

The present invention relates generally to semiconductors, and more particularly, to fin-type field effect transistors (FinFETs).

BACKGROUND

As integrated circuits continue to scale downward in size, the finFET (fin field effect transistor) is becoming an attractive device for use with modern semiconductor devices. In a finFET, the channel is formed by a semiconductor vertical fin (as compared with a planar channel in a conventional CMOS), and a gate electrode is located and wrapped around the vertical fin. FinFETs are commonly formed using one of two structure types of substrate. A bulk structure is one where the fins are formed in the bulk semiconductor substrate, with a gate formed above the bulk substrate. A silicon-on-insulator (SOI) structure is one where fins are formed in a thin semiconductor layer that sits on an insulator layer disposed on the bulk substrate (i.e. Si-on-oxide, or SOI substrate), with the gate formed over the thin semiconductor layer. Each structure type has various advantages and disadvantages.

SUMMARY

In a first aspect of the present invention, there is provided a semiconductor structure having a semiconductor substrate, an insulator layer disposed on the semiconductor substrate, a plurality of fins disposed on the semiconductor structure, an epitaxial semiconductor region in direct physical contact with the plurality of fins, wherein the epitaxial semiconductor region traverses the insulator layer and is in direct physical contact with the semiconductor substrate, and a gate region disposed on the insulator layer.

In a second aspect of the present invention, there is provided a semiconductor structure having a semiconductor substrate; an insulator layer disposed over the semiconductor substrate, a plurality of fins disposed over the semiconductor structure; an N-type field effect transistor (NFET) formed on the semiconductor structure, comprising a source/drain region, and a gate; a P-type field effect transistor (PFET) formed on the semiconductor structure, comprising a source/drain region, and a gate; wherein the source/drain region of the NFET and the source/drain region of the PFET each comprise a plurality of fins that are electrically connected to the semiconductor substrate; and wherein the gate of the NFET and the gate of the PFET are disposed over the insulator layer.

In a third aspect of the invention, there is provided a method of forming a semiconductor structure having the steps of forming an insulator layer on a bulk semiconductor substrate, forming a semiconductor-on-insulator (SOI) layer on the insulator layer, forming a plurality of fins on the SOI layer, forming a gate on the SOI layer; removing a portion of the insulator layer adjacent to the plurality of fins; and forming an epitaxial semiconductor region on the plurality of fins, wherein the epitaxial semiconductor region is connected to the bulk semiconductor substrate.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on, "positioned atop", or "disposed on", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

Embodiments of the present invention provide an improved finFET and method of fabrication. Embodiments provide a finFET structure with source/drain regions electrically connected to the bulk semiconductor substrate with an epitaxial semiconductor layer. In embodiments, the bulk semiconductor substrate comprises a silicon substrate. The fabrication process starts with a commercially available silicon-on-insulator (SOI) substrate, with an insulator layer, referred to as buried oxide (BOX) layer disposed on a bulk semiconductor substrate, and a thin silicon layer disposed above the BOX layer. Fins are formed on the thin silicon layer, and a portion of the BOX layer adjacent to the fins is removed, exposing a portion of the bulk semiconductor substrate. An epitaxial semiconductor is grown from the substrate and in direct physical contact with, and also electrically connect to the fins, while the gate remains disposed over the insulator layer. This provides the benefits of an FinFET on an SOI substrate, such as good fin height control and good source/drain punch-through leakage control (reduced leakage currents), and also provides benefits of a bulk structure, including a larger epitaxial volume for inducing stress in the transistor channel to enhance carrier mobility, and improved thermal transfer characteristics. Hence, embodiments of the present invention provide a finFET that has benefits of both bulk finFETs and SOI finFETs.

Figure 1:
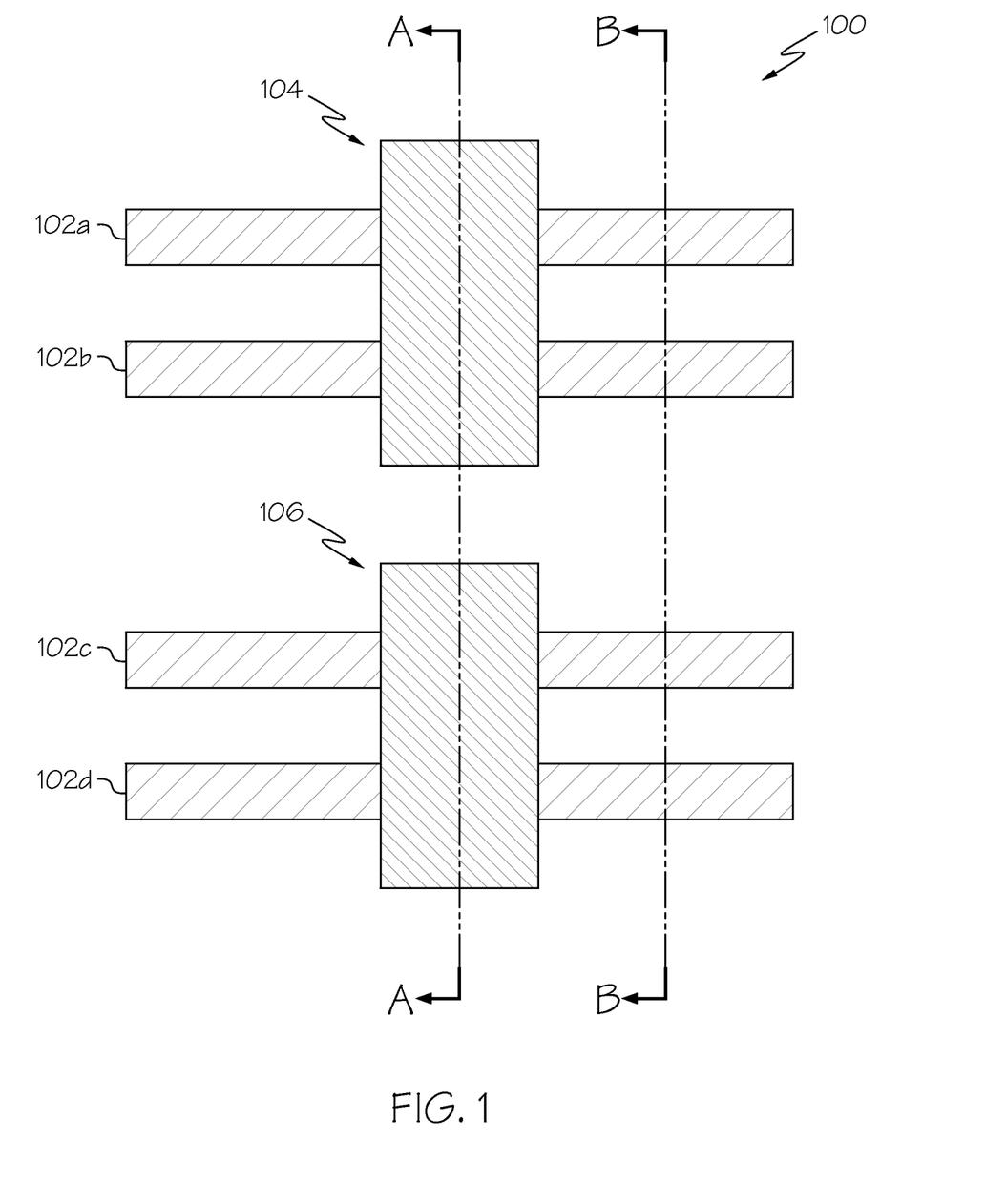
FIG. 1 is a top down view of a semiconductor structure in accordance with illustrative embodiments.

FIG. 1 is a top down view of a semiconductor structure 100 in accordance with illustrative embodiments. The semiconductor structure comprises NFET fins 102a, 102b and PFET fins 102c, 102d, which are formed from an SOI layer, and further discussed with regard to FIG. 2. Further shown is a PFET gate 104 and an NFET gate 106. It should be recognized that although four fins and two gates are shown, in some embodiments, more or fewer fins per transistor may be present.

Figure 2:
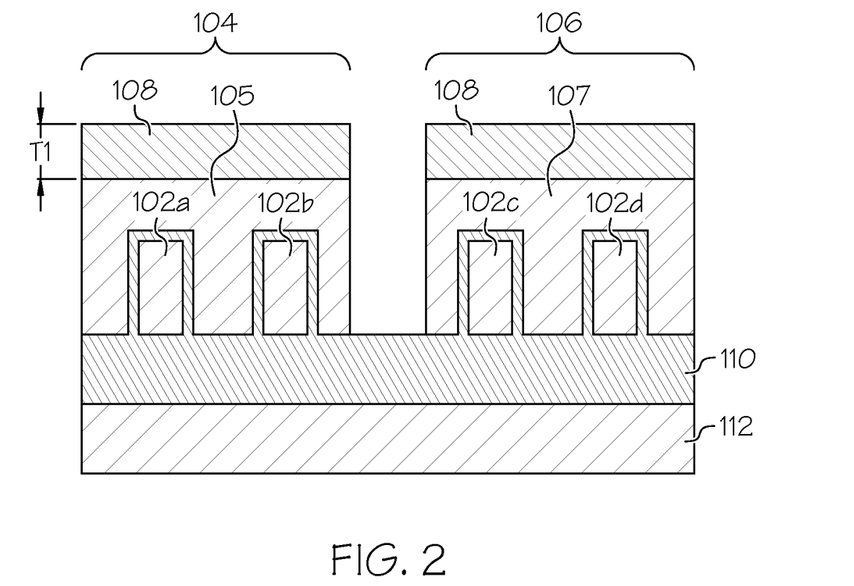
FIG. 2 is a cross-section of the semiconductor structure of FIG. 1 along A-A'.

FIG. 2 is a cross-sectional view of the semiconductor structure of FIG. 1 along A-A' at the step after gate structure is patterned. The semiconductor structure therein comprises a buried oxide (BOX) layer 110 disposed on a bulk semiconductor substrate 112, and the thin silicon (SOI) layer comprising the fins 102a-d disposed on the BOX layer 110. The semiconductor structure comprises an NFET region 104 and a PFET region 106. The NFET fins 102a, 102b are disposed in NFET region 104, and the PFET fins 102c, 102d are disposed in PFET region 106. A PFET gate 105 and an NFET gate 107 are disposed in the NFET region 104 and the PFET region 106, respectively. In embodiments, there may be a thin gate dielectric layer between the gate 105. 107 and fins 102a, 102b, 102c, 102d (not shown). A pre-deposited layer 108 of silicon nitride (SiN) is disposed over each of the gates 105 and 107. In embodiments, thickness of layer 108, shown as T1, may range from about 50 nanometers to about 150 nanometers.

Figure 3:
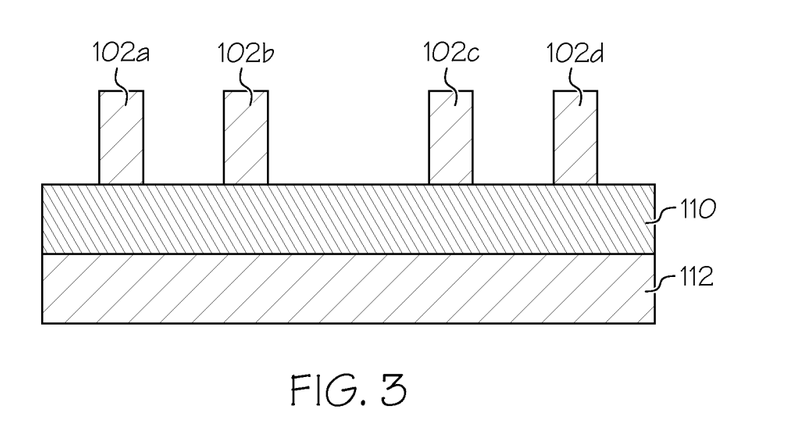
FIG. 3 is a cross-section of the semiconductor structure of FIG. 1 along B-B'.

FIG. 3 is a cross-sectional view of the semiconductor structure of FIG. 1 along B-B'. The semiconductor structure therein comprises a buried oxide (BOX) layer 110 disposed on the bulk semiconductor substrate 112, and fins 102a-d disposed on the BOX 110.

Figure 4:
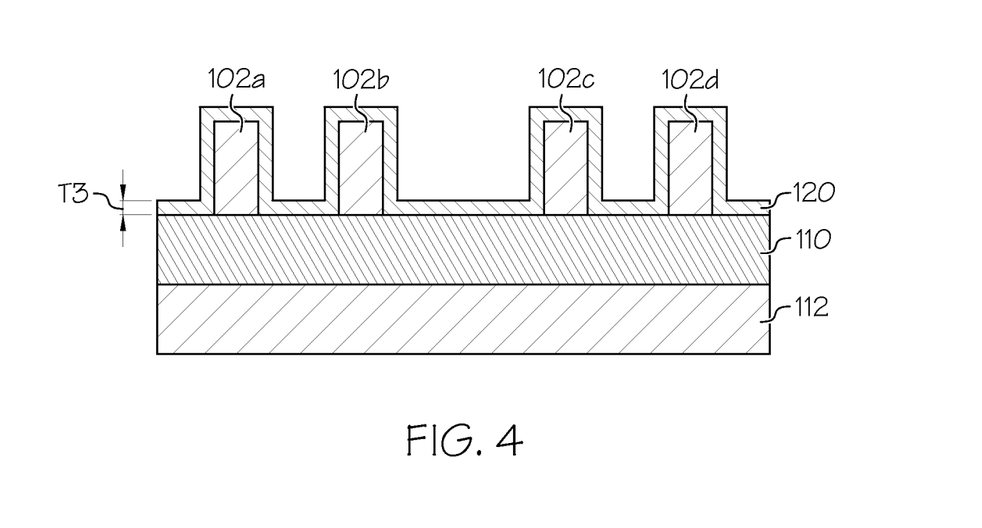
FIG. 4 shows a semiconductor structure along line B-B' of FIG. 1 after a subsequent processing step of depositing a nitride layer.

FIG. 4 shows the semiconductor structure along line B-B' of FIG. 1 after a subsequent processing step of depositing a second silicon nitride (SiN) layer 120 over the NFET region 104 and the PFET region 106. In some embodiments, the silicon nitride layer 120 may function as a spacer. In some embodiments, thickness T3 may range from about 10 nanometers to about 40 nanometers.

Figure 5:
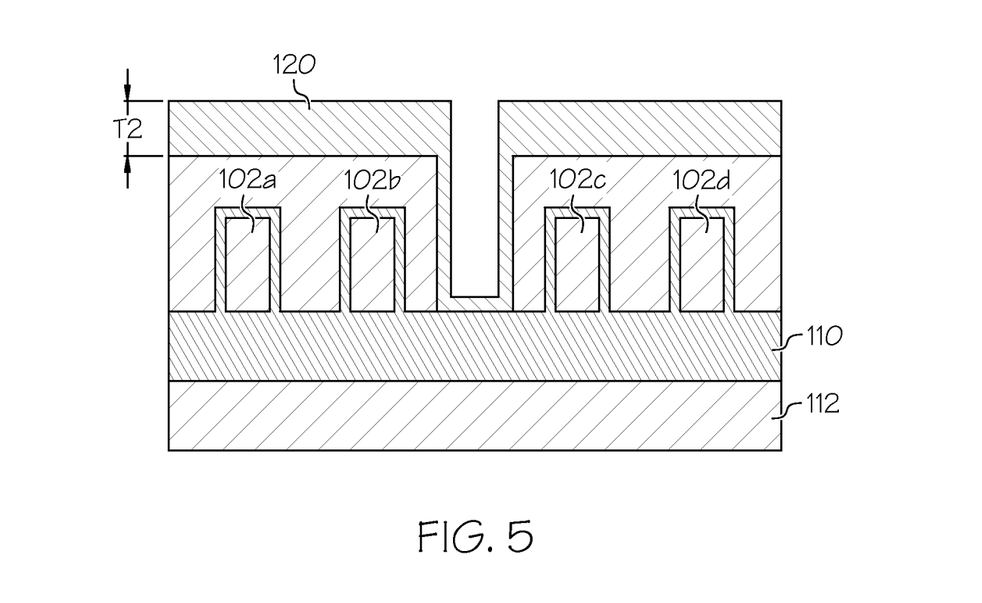
FIG. 5 shows a semiconductor structure along line A-A' of FIG. 1 after the subsequent processing step of depositing a nitride layer.

FIG. 5 shows the semiconductor structure along line A-A' of FIG. 1 after the subsequent processing step of depositing a second SiN layer 120, so that the total SiN layer thickness T2 may range from about 60 nanometers to about 190 nanometers (i.e. T1+T3).

Figure 6:
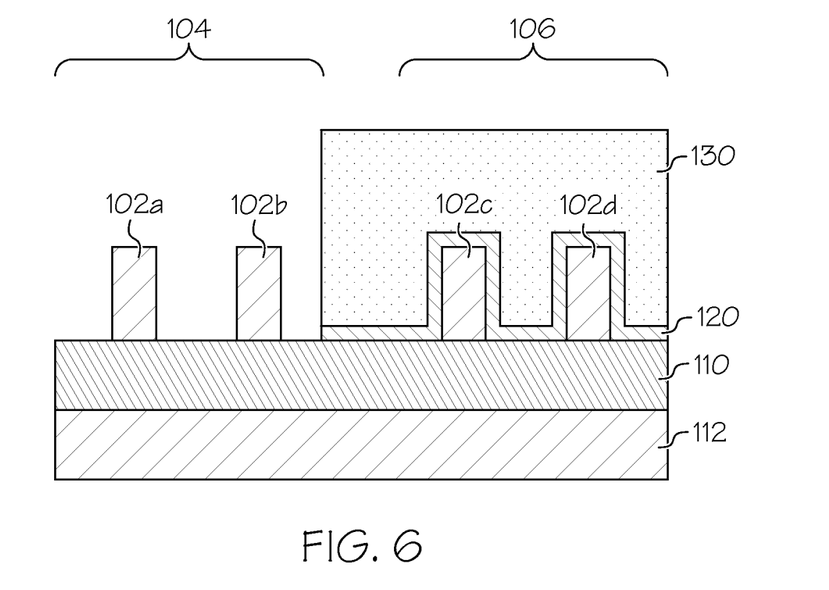
FIG. 6 shows a semiconductor structure along line B-B' of FIG. 1 after a subsequent processing step of opening the NFET active region.

FIG. 6 shows a semiconductor structure along line B-B' of FIG. 1 after a subsequent processing step of exposing the NFET fins 102a and 102b. A mask, for example, photoresist 130, is applied over the PFET fins 102c and 102d. A portion of the SiN layer 120 over the NFET region 104 is then etched away by plasma etching. It should be recognized that in some embodiments, other masking techniques may be used in addition or alternatively to photoresist.

Figure 7:
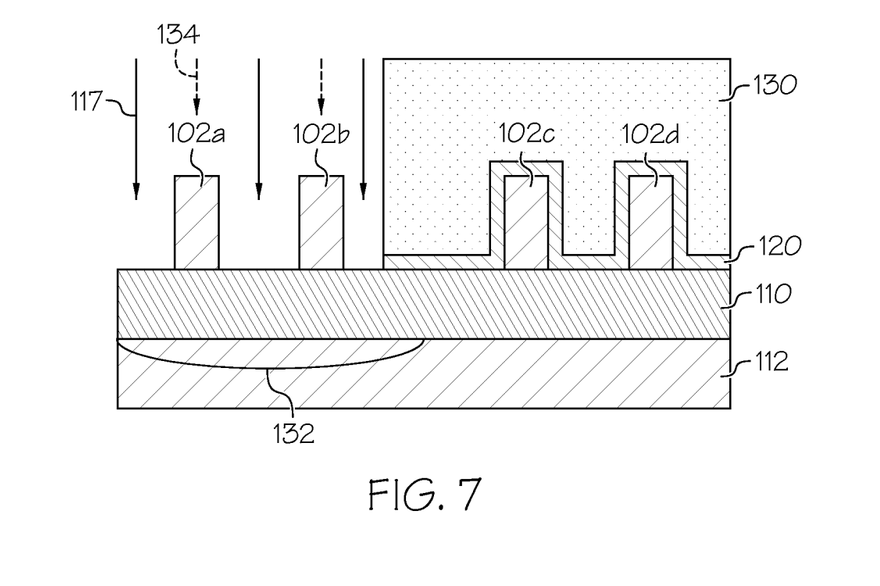
FIG. 7 shows a semiconductor structure along line B-B' of FIG. 1 after a subsequent processing step of adding dopants to the NFET active region.

FIG. 7 shows the semiconductor structure along line B-B' of FIG. 1 after a subsequent processing step of adding dopants to the NFET region. A deep P-type implant (indicated by arrows 117) is made to form P-well 132, and a shallow NFET source/drain (SD) implant (indicated by arrows 134) is performed to add dopants to the NFET fins 102a and 102b. The dopants are introduced via an ion implantation process. In embodiments, the well implant may be performed first, followed by the SD implant. In embodiments, the P-type implant species comprises boron (B). In embodiments, the NFET SD implant comprises phosphorus (P) or arsenic (As). In embodiments, the dopant concentration for the NFET SD may range from about 5E18 (i.e. $5 \times 10^{18}$) atoms per cubic centimeter to about 5E19 atoms per cubic centimeter. In embodiments, the dopant concentration for the P well may range from about 1E17 atom per cubic centimeter to about 1E18 atoms per cubic centimeter.

Figure 8:
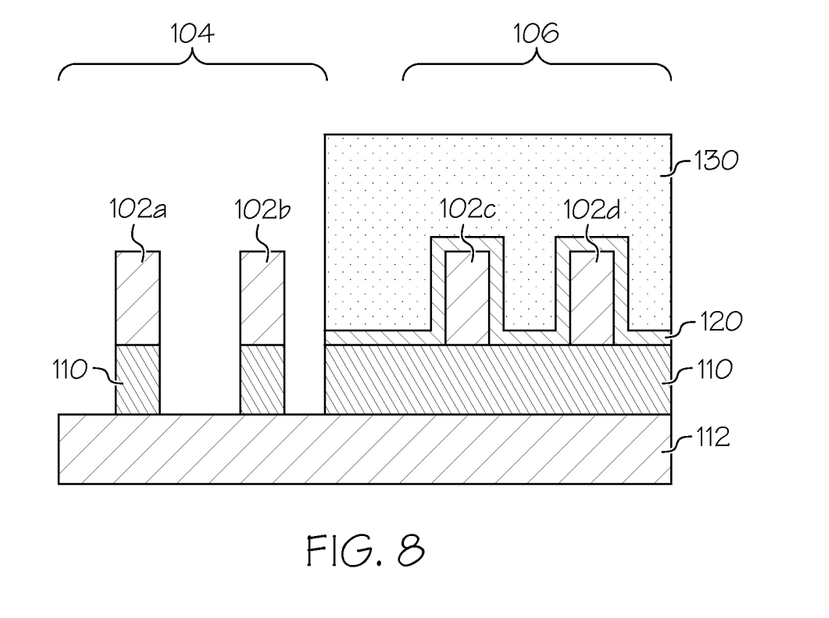
FIG. 8 shows a semiconductor structure along line B-B' of FIG. 1 after a subsequent processing step of removing a portion of the oxide in the NFET active region.

FIG. 8 shows the semiconductor structure along line B-B' of FIG. 1 after a subsequent processing step of removing a portion of the buried oxide 110 from the NFET region 104.

This may be performed by an anisotropic etch, such as a selective reactive ion etch (RIE), or any other suitable process.

Figure 9:
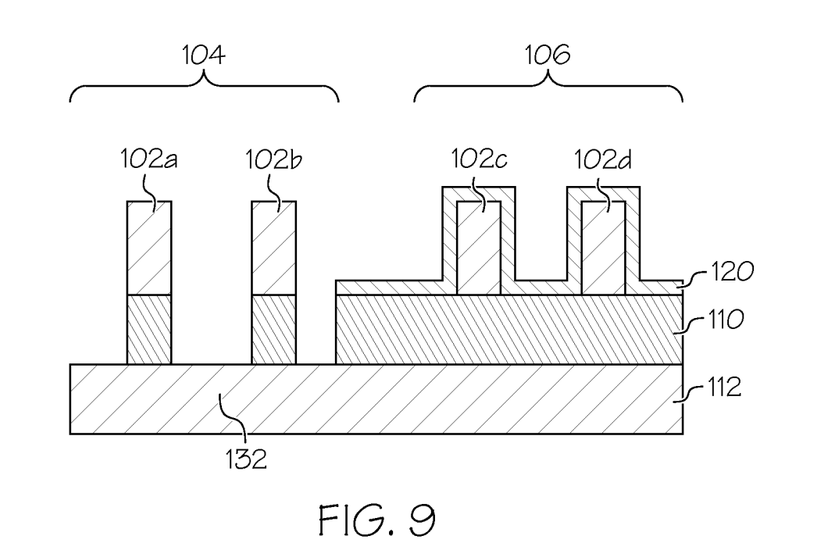
FIG. 9 shows a semiconductor structure along line B-B' of FIG. 1 after a subsequent processing step of removing the photoresist.

FIG. 9 shows the semiconductor structure along line B-B' of FIG. 1 after a subsequent processing step of removing the photoresist 130 from the PFET region 106.

Figure 10:
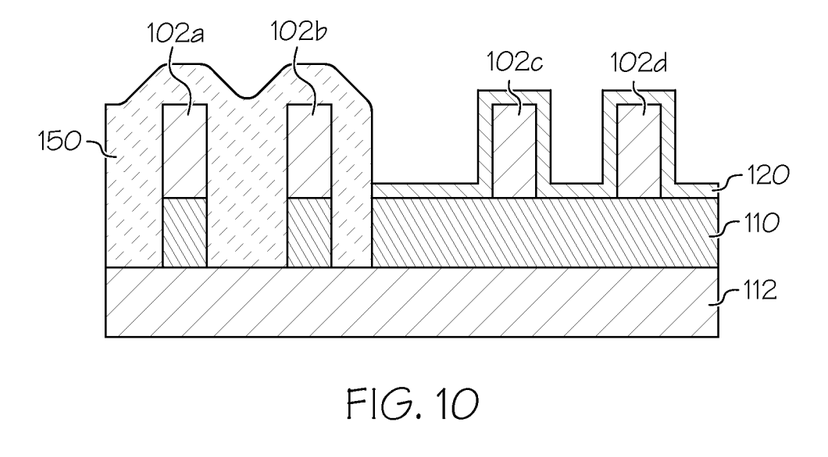
FIG. 10 shows a semiconductor structure along line B-B' of FIG. 1 after a subsequent processing step of connecting the NFET fins to bulk.

FIG. 10 shows the semiconductor structure along line B-B' of FIG. 1 after a subsequent processing step of connecting the NFET fins 102a, 102b to the bulk semiconductor substrate 112. This may be performed via a selective epitaxial growth (SEG) process. In embodiments, the region formed by epitaxial semiconductor material 150 may comprise silicon. In other embodiments, the epitaxial semiconductor material 150 may comprise Si:C (carbon-doped silicon) which can be used to enhance n-type carrier mobility for NFETs. The carbon may be introduced via an in-situ doping during the SEG process. The epitaxial semiconductor material 150 may also be doped with phosphorous or other N-type dopant.

Figure 11:
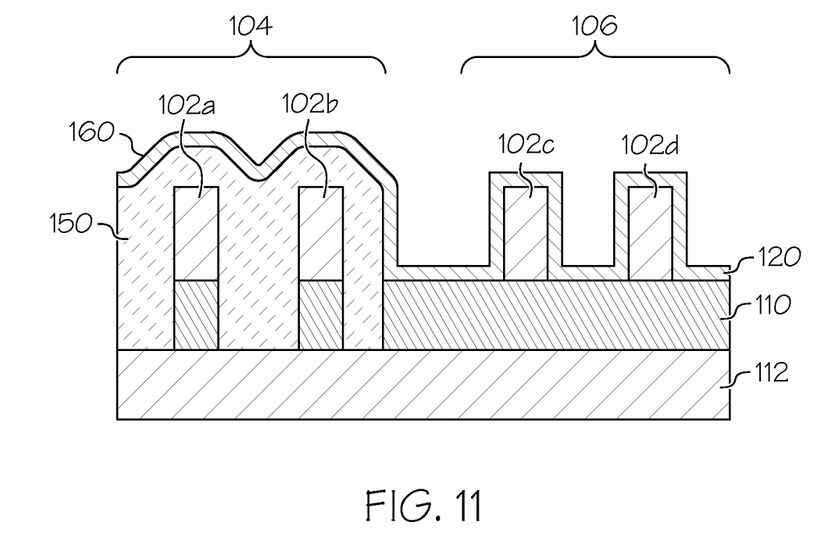
FIG. 11 shows a semiconductor structure along line B-B' of FIG. 1 after a subsequent processing step of depositing a nitride layer.

FIG. 11 shows the semiconductor structure along line B-B' of FIG. 1 after a subsequent processing step of depositing an additional (third) silicon nitride (SiN) layer 160 over entire structure, to protect the NFET region 104. As a result of depositing SiN layer 160, the SiN layer over the PFET region 106 becomes slightly thicker. The SiN layer is sacrificial, and will be removed in subsequent processing. In embodiments, the SiN may be deposited via an atomic layer deposition (ALD) process. In other embodiments, the SiN may be deposited via a plasma enhanced chemical vapor deposition (PECVD) process. In some embodiments, the SiN may act as a spacer.

Figure 12:
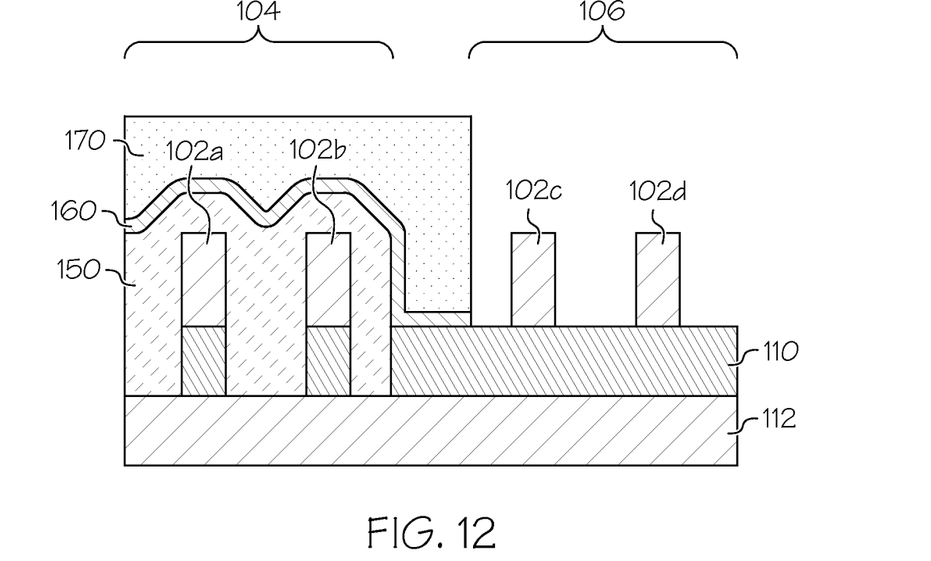
FIG. 12 shows a semiconductor structure along line B-B' of FIG. 1 after a subsequent processing step of opening the PFET active region.

FIG. 12 shows the semiconductor structure along line B-B' of FIG. 1 after a subsequent processing step of opening the PFET region 106. A mask, for example, photoresist 170, is applied, and then the SiN layer 120 is removed by plasma etching from the PFET region 106. It should be recognized that in some embodiments, another masking technique/material may be used in addition to or alternatively to photoresist.

Figure 13:
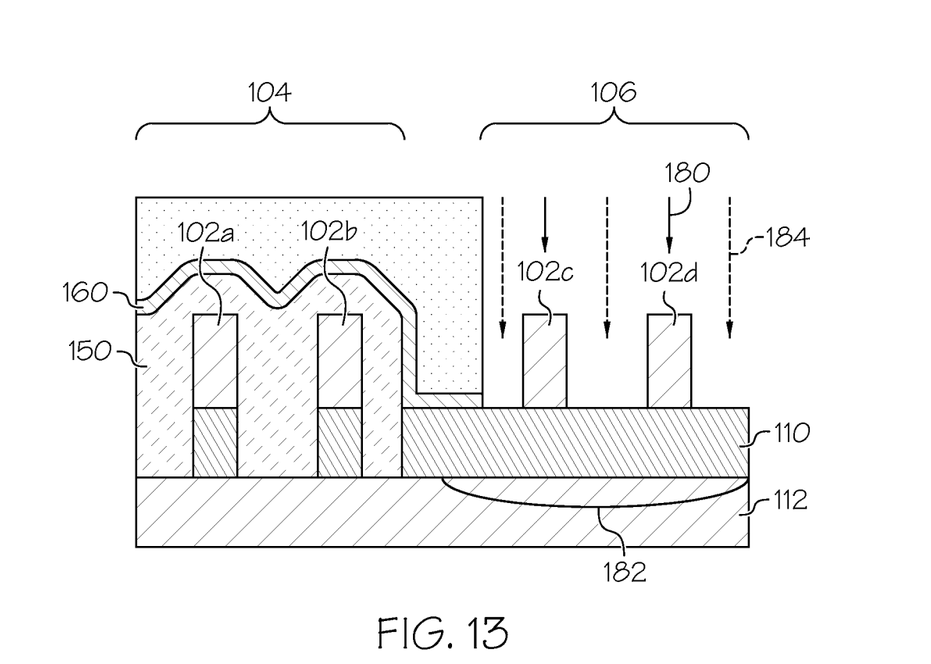
FIG. 13 shows a semiconductor structure along line B-B' of FIG. 1 after a subsequent processing step of adding dopants to the PFET active region.

FIG. 13 shows a semiconductor structure along line B-B' of FIG. 1 after a subsequent processing step of adding dopants to the PFET region 106. A shallow P-type source/drain (SD) implant (indicated by arrows 180) is performed to add dopants to the PFET fins 102c, 102d. A deep N-type implant (indicated by arrows 184) is made to form N-well 182. The dopants are introduced via an ion implantation process. In embodiments, the well implant may be performed first, followed by the SD implant. In embodiments, the P implant species comprises boron. In embodiments, the PFET SD implant comprises boron. In embodiments, the dopant concentration for the PFET SD implant may range from about 5E18 atoms per cubic centimeter to about 5E19 atoms per cubic centimeter. The dopant concentration for the P well may range from about 1E17 atom per cubic centimeter to about 1E18 atoms per cubic centimeter.

Figure 14:
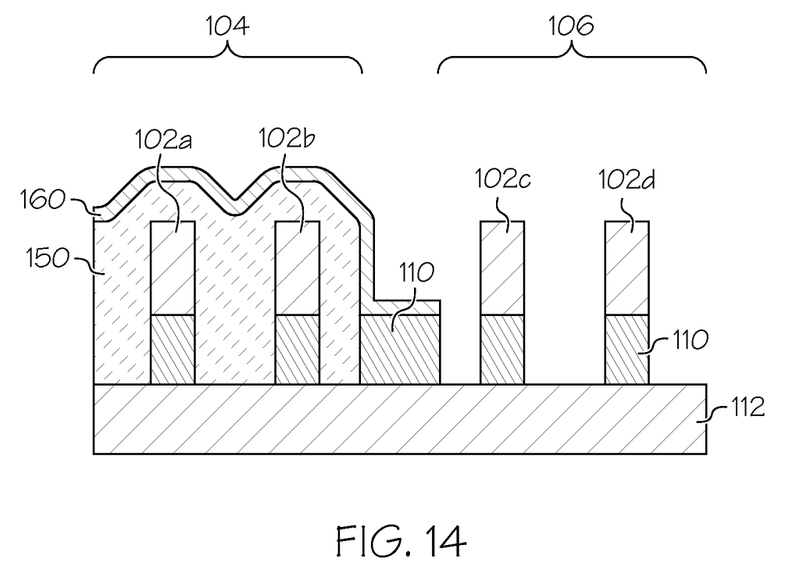
FIG. 14 shows a semiconductor structure along line B-B' of FIG. 1 after a subsequent processing step of removing a portion of the oxide in the PFET active region.

FIG. 14 shows the semiconductor structure along line B-B' of FIG. 1 after a subsequent processing step of removing a portion of the buried oxide 110 in the PFET region 106. This may be performed with an anisotropic etch, such as a selective reactive ion etch (RIE), or any other suitable process.

Figure 15:
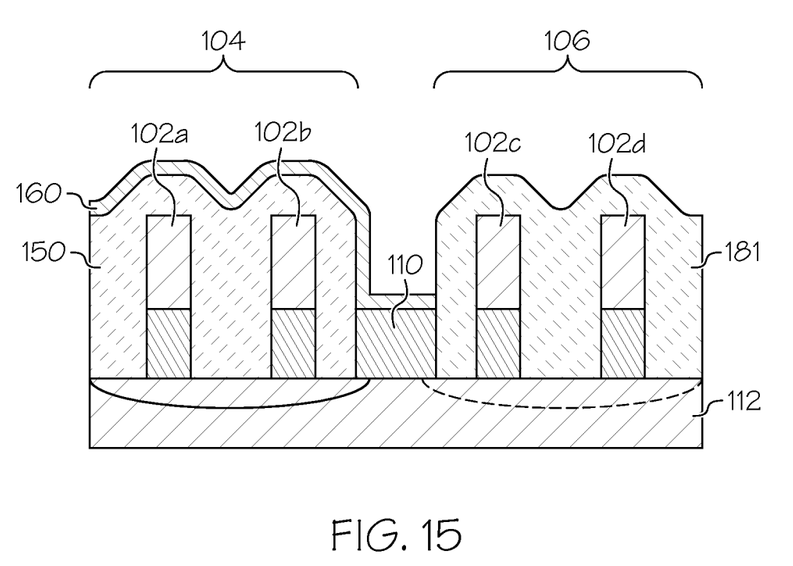
FIG. 15 shows a semiconductor structure along line B-B' of FIG. 1 after a subsequent processing step of connecting the PFET fins to bulk.
Figure 16:
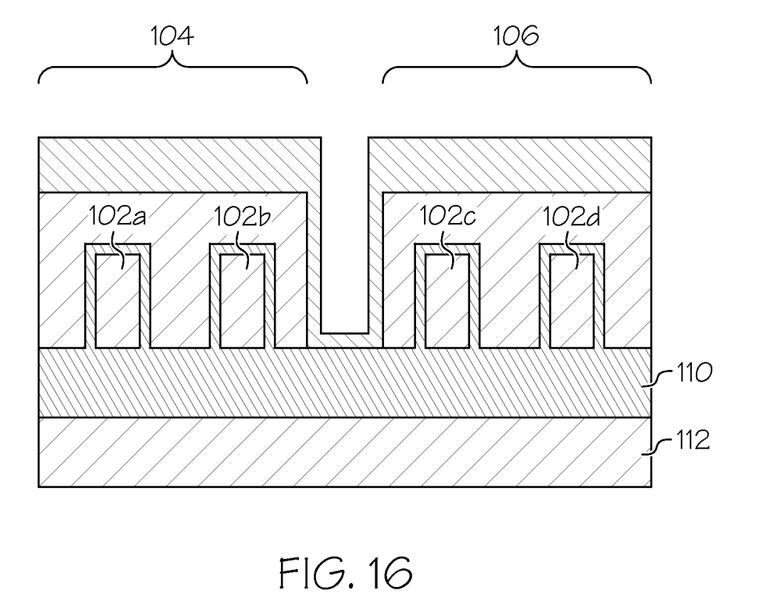
FIG. 16 shows a semiconductor structure along line A-A' of FIG. 1 after the subsequent processing step of connecting the PFET fins to bulk.

FIG. 15 shows the semiconductor structure along line B-B' of FIG. 1 after a subsequent processing step of connecting the PFET fins 102c, 102d to the bulk silicon substrate 112. FIG. 16 shows the semiconductor structure along line A-A' of FIG. 1 after the subsequent processing step of connecting the PFET fins 102c, 102d to the bulk silicon substrate 112. This may be performed via a selective epitaxial growth (SEG) process. In embodiments, the epitaxial semiconductor material 181 may comprise silicon. In other embodiments, the epitaxial semiconductor material 181 may comprise SiGe (silicon germanium), which can be used to induce stress to enhance p-type carrier mobility for PFETs. The epitaxial semiconductor material 181 may also be doped with a P-type dopant, such as boron.

From this point forward, industry-standard processes may be used to complete the fabrication of the finFET. This may include formation of additional dielectric layers, silicide, contact, via, and interconnect metallization layers, as well as packaging processes.

Figure 17:
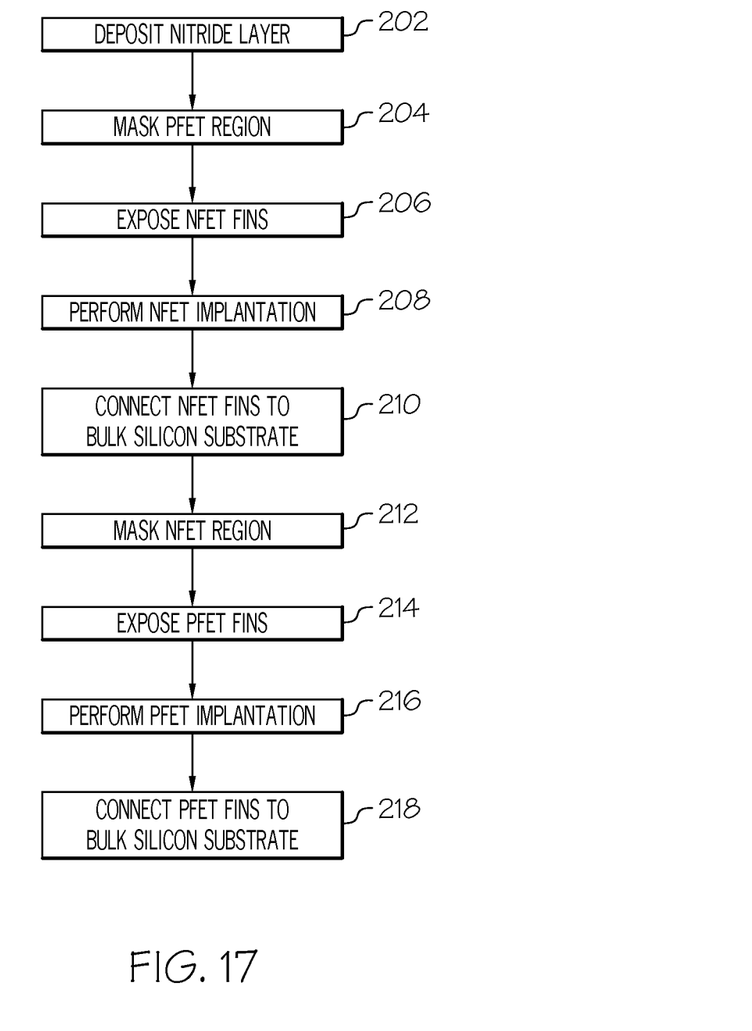
FIG. 17 is a flowchart indicating process steps for an embodiment of the present invention.

FIG. 17 is a flowchart indicating process steps for embodiments of the present invention. At 202, a silicon nitride layer is deposited over an NFET region and a PFET region of a semiconductor structure. At 204, a mask is applied to the PFET region. At 206, NFET fins of the semiconductor structure are exposed. At 208, an NFET implantation is performed. At 210, the NFET fins are connected to a bulk oxide substrate of the semiconductor structure. At 212, a mask is applied to the NFET region. At 214, PFET fins of the semiconductor structure are exposed. At 216, a PFET implantation is performed. At 218, the PFET fins are connected to the bulk silicon substrate.

It should be recognized that in some embodiments, more or fewer steps may be performed and/or the steps may be performed in a different order than that shown herein without departing from the scope of the present invention. For example, in some embodiments, steps 212-218 could be performed before steps 204-210.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
    a semiconductor substrate;
    an insulator layer disposed on the semiconductor substrate;
    a plurality of fins disposed on the semiconductor structure;
    an epitaxial semiconductor region in direct physical contact and electrically connected with the plurality of fins, wherein the epitaxial semiconductor region traverses the insulator layer and is in direct physical contact with the semiconductor substrate; and
    a gate region disposed on the insulator layer.

2. The semiconductor structure of claim 1, wherein the insulator layer comprises silicon oxide.

3. The semiconductor structure of claim 1, wherein the semiconductor substrate comprises a silicon substrate.

4. The semiconductor structure of claim 1, wherein the epitaxial semiconductor region comprises silicon.

5. The semiconductor structure of claim 1, wherein the epitaxial semiconductor region comprises carbon-doped silicon.

6. The semiconductor structure of claim 1, wherein the epitaxial semiconductor region comprises silicon germanium.

7. The semiconductor structure of claim 1, wherein at least one fin of the plurality of fins is doped with a P-type dopant, and wherein an N-well is formed in the semiconductor substrate in a region located below the at least one fin of the plurality of fins.

8. The semiconductor structure of claim 1, wherein at least one fin of the plurality of fins is doped with a N-type dopant, and wherein a P-well is formed in the semiconductor substrate in a region located below the at least one fin of the plurality of fins.

9. A semiconductor structure comprising:
   a semiconductor substrate;
   an insulator layer disposed over the semiconductor substrate;
   a plurality of fins disposed over the semiconductor structure;
   an N-type field effect transistor (NFET) formed on the semiconductor structure, comprising a source/drain region, and a gate;
   a P-type field effect transistor (PFET) formed on the semiconductor structure, comprising a source/drain region, and a gate;
   wherein the source/drain region of the NFET and the source/drain region of the PFET each comprise a plurality of fins that are electrically connected to the semiconductor substrate; and
   wherein the gate of the NFET and the gate of the PFET are disposed over the insulator layer.

10. The semiconductor structure of claim 9, wherein the insulator layer comprises silicon oxide.

11. The semiconductor structure of claim 9, wherein the semiconductor substrate comprises a silicon substrate.

12. The semiconductor structure of claim 9, wherein the plurality of fins of the NFET are electrically connected to the semiconductor substrate with an epitaxial semiconductor region comprising carbon-doped silicon.

13. The semiconductor structure of claim 12, wherein the plurality of fins of the PFET are electrically connected to the semiconductor substrate with an epitaxial semiconductor region comprising silicon germanium.

14. A method of forming a semiconductor structure comprising:
   forming an insulator layer on a bulk semiconductor substrate;
   forming a semiconductor-on-insulator (SOI) layer on the insulator layer;
   forming a plurality of fins on the SOI layer;
   forming a gate on the SOI layer;
   removing a portion of the insulator layer adjacent to the plurality of fins; and
   forming an epitaxial semiconductor region on the plurality of fins, wherein the epitaxial semiconductor region is connected to the bulk semiconductor substrate and is in direct physical contact and electrically connected with the plurality of fins.

15. The method of claim 14, wherein removing a portion of the insulator layer is performed via a reactive ion etch process.

16. The method of claim 14, wherein forming an epitaxial semiconductor region on the plurality of fins comprises forming an epitaxial silicon region.

17. The method of claim 14, wherein forming an epitaxial semiconductor region on the plurality of fins comprises forming an epitaxial silicon germanium region.

18. The method of claim 14, wherein forming an insulator on a bulk semiconductor substrate comprises forming a silicon oxide layer.

19. The method of claim 14, further comprising, performing a well implant on the semiconductor structure.

20. The method of claim 19, further comprising performing a shallow implant on the plurality of fins.

\* \* \* \* \*